United States Patent
Brink et al.

[11] Patent Number: 6,114,838
[45] Date of Patent: Sep. 5, 2000

[54] BATTERY CAPACITY TEST METHOD AND APPARATUS

[75] Inventors: Gregory D. Brink; David L. Burton, both of McMinnville, Oreg.

[73] Assignee: Agilent Technologies, Inc., Santa Clara, Calif.

[21] Appl. No.: 09/203,856

[22] Filed: Dec. 2, 1998

[51] Int. Cl.[7] .............................. H02J 7/00; G08B 21/00
[52] U.S. Cl. ..................... 320/136; 320/162; 340/636; 324/430
[58] Field of Search .................. 320/162, 161, 320/136, 132; 340/636; 324/430

[56] References Cited

U.S. PATENT DOCUMENTS

| | | | |
|---|---|---|---|
| 4,948,683 | 8/1990 | Picozzi et al. | 429/90 |
| 4,968,567 | 11/1990 | Schisselbauer | 429/90 |
| 5,352,968 | 10/1994 | Reni et al. | 320/136 |
| 5,411,817 | 5/1995 | Ridgway et al. | 429/90 |
| 5,478,665 | 12/1995 | Burroughs et al. | 429/90 |
| 5,543,246 | 8/1996 | Treger | 429/90 |
| 5,600,231 | 2/1997 | Parker | 320/48 |
| 5,604,049 | 2/1997 | Weiss et al. | 429/93 |
| 5,614,333 | 3/1997 | Hughen et al. | 429/93 |
| 5,614,804 | 3/1997 | Kayano et al. | 320/134 |
| 5,626,978 | 5/1997 | Weiss et al. | 429/43 |
| 5,650,937 | 7/1997 | Bounaga | 364/483 |
| 5,658,316 | 8/1997 | Lamond et al. | 607/5 |
| 5,709,962 | 1/1998 | Bailey | 429/93 |
| 5,721,482 | 2/1998 | Benvegar et al. | 320/43 |
| 5,751,217 | 5/1998 | Kchao et al. | 340/636 |
| 5,773,978 | 6/1998 | Becker | 324/430 |
| 5,959,508 | 10/1999 | Patino et al. | 320/153 |

*Primary Examiner*—Adolf Deneke Berhane
*Assistant Examiner*—Gregory J Toatley, Jr.

[57] ABSTRACT

A battery capacity tester method and apparatus are provided. The battery capacity tester determines the present internal battery impedance by measuring terminal voltages during successive applications of a known load, each load drawing a predetermined current from the battery. This calculated internal battery impedance is used to determine battery capacity based on a precharacterization of the battery that establishes a relationship between the internal battery impedance and the remaining battery capacity.

20 Claims, 5 Drawing Sheets

BATTERY CAPACITY TEST METHOD AND APPARATUS

BACKGROUND OF THE INVENTION

1. Field of the Invention

The present invention relates generally to batteries and, more particularly, to determining the capacity of a battery.

2. Related Art

Sudden cardiac arrest, i.e., a heart attack, has been attributed to over 350,000 deaths each year in the United States, making it one of the country's leading medical emergencies. World-wide, sudden cardiac arrest has been attributed to a much larger number of deaths each year. One of the most common, and life threatening, consequences of a heart attack is the development a cardiac arrhythmia commonly referred to as ventricular fibrillation. When in ventricular fibrillation the heart muscle is unable to pump a sufficient volume of blood to the body and, more importantly, to the brain. Ventricular fibrillation is generally identifiable by the victim's immediate loss of pulse, loss of consciousness and a cessation of breathing. The lack of blood and oxygen to the brain may result in brain damage, paralysis or death to the victim.

The probability of surviving a heart attack or other serious heart arrhythmia depends on the speed with which effective medical treatment is provided. There are four critical components of effective medical treatment that must be administered to a victim of sudden cardiac arrest: (1) early cardiopulmonary resuscitation to keep the blood oxygenated and flowing to the victim's brain and other vital organs; (2) early access to emergency care; (3) early cardiac defibrillation to restore the heart's regular rhythm; and (4) early access to advanced medical care. If prompt cardiopulmonary resuscitation is followed by defibrillation within approximately four minutes of the onset of symptoms, the victim's chances of surviving sudden cardiac arrest can approach or exceed forty percent. Prompt administration of defibrillation within the first critical minutes is considered one of the most important components of emergency medical treatment for preventing death from sudden cardiac arrest.

Cardiac defibrillation is an electric shock that is used to arrest the chaotic cardiac contractions that occur during ventricular fibrillation and to restore a normal cardiac rhythm. To administer this electrical shock to the heart, defibrillator pads are placed on the victim's chest, and an electrical impulse of the proper size and shape is administered to the victim in the form of an electric shock.

Recently, portable external defibrillators for use by first responders have been developed. A portable defibrillator allows proper medical care to be given to a victim earlier than preceding defibrillators, increasing the likelihood of survival. Such portable defibrillators may be brought to or stored in an accessible location at a business, home, aircraft or the like, ready for use by first responders. With recent advances in technology, even a minimally trained individual can operate conventional portable defibrillators to aid a heart attack victim in the critical first few minutes subsequent to onset of sudden cardiac arrest.

Portable defibrillators require a portable energy source to operate in the anticipated mobile environment. Although several manufacturers have provided customized battery packs for their portable defibrillators, some are designed to use a standard, commonly available, rechargeable battery pack, such as those used in video camcorders. These defibrillators incorporate battery interface adapters for mechanically and electrically connecting the standard battery packs to the defibrillator. The use of standard battery packs allows for a less expensive battery solution. Such battery packs may be, for example, a sealed lead acid (SLA) battery, a nickel cadmium (NiCd) battery, a lithium (Li) battery or the like.

Portable defibrillators may remain unused in their storage area for hours, days, or even weeks without having been tested or maintained by a user, and months or even years without being actually used. During such extended periods of time the battery may discharge significantly and have an insufficient charge to recharge the defibrillator during use. As a result, to ensure reliable defibrillator operations, it is critical that the condition of the battery pack be determined prior to operation. The user may then determine whether the installed or a replacement battery should be used.

Currently, three procedures or tests are commonly utilized to determine the present capacity of a battery, referred to herein as "remaining battery capacity." One conventional battery capacity test measures the time to completely discharge a fully charged battery into a known load. One drawback is that this technique requires a known load to be provided over a very long period of time. Inclusion of such a long load discharge cycle significantly increases the cost and complexity of the procedure. Another deficiency is that this test often requires hours to perform since the battery must be fully charged, and then fully discharged. Furthermore, since the battery must be completely discharged under well-known and controlled conditions, the battery powered device is unavailable for use during this test. In addition, for the battery to be used, it must be fully recharged upon completion of the test, further extending the unavailability of the battery. An additional problem is that this test decreases battery life for certain types of batteries such as NiCd or SLA batteries, reducing the number of remaining available charge cycles. Thus, although relatively accurate, this test is time consuming, inconvenient, and adversely affects the battery life and availability.

Another conventional battery capacity test, commonly referred to as an open circuit voltage test, measures the battery voltage without an attached load. This test is utilized only for certain types of batteries, such as SLA batteries, which are characterized by a predictable decrease in terminal voltage as the battery is used. The remaining battery capacity is estimated based on this decrease in voltage. However, many other battery types such as lithium batteries, silver batteries, and mercury batteries do not exhibit such a continual and predicable decrease in voltage during use. As a result, this test is not suitable for such batteries. In addition, this test is also temperature dependent. The ambient temperature will effect the battery voltage and thus the estimation of battery capacity. Also, if the battery is partially depleted, this test will be less accurate because the relationship between voltage an capacity will have changed. Thus, although relatively fast and roughly accurate, this test can only be utilized to test a minority of battery types.

A third conventional technique for testing battery capacity, commonly referred to as a battery fuel gauge, is a battery monitoring circuit that measures the current output from the battery during use, and the current input to the battery during charging cycles. The battery monitoring circuit determines the remaining capacity of the battery based on a tally of the cumulative input and output currents. This test is accurate, however, only when proper maintenance has been performed on the battery. For example, NiCd batteries require reconditioning cycles to be performed periodically. These reconditioning cycles return the all the NiCd cells within the battery pack to a full charge. Without the proper reconditioning cycles, the NiCd cells may develop a charge memory or a cell imbalance. A cell imbalance occurs when one cell of a battery pack discharges more quickly than the other cells. As the other cells in the battery pack supply current to the load, the discharged cell will be reverse charged. This reverse charge will decrease the NiCd cell life and, therefore, reduce the life of the battery pack. If the NiCd cells within the battery pack develop a charge memory, the NiCd cells will appear to be at full capacity, but in fact will be charged to only a fraction of their total capacity. Thus, the accuracy of this test is dependent upon the ability to consider the maintenance history of the battery between reconditioning procedures.

What is needed, therefore, is a fast and accurate method and apparatus for determining the capacity of a variety of battery types and chemistries under a variety of conditions.

SUMMARY OF THE INVENTION

The present invention is a fast and accurate remaining battery capacity testing system and associated methodology that overcomes the above and other drawbacks of conventional techniques. The present invention determines the remaining battery capacity based on a measured battery impedance and a predetermined relationship between battery impedance and the remaining battery capacity for the battery under test.

In one aspect of the invention a battery capacity tester is disclosed. The battery capacity tester determines remaining battery capacity of a battery coupled to the tester as a function of the present internal battery impedance. In the illustrated embodiments, the tester determines an internal battery impedance by measuring terminal voltages during one or more successive applications of a known load, each load drawing a predetermined constant current from the battery. The calculated internal battery impedance is used to determine the remaining battery capacity based on a pre-characterized relationship between internal battery impedance and battery capacity for the battery under test. This precharacterization is derived from data provided by the battery manufacturer, derived empirically, or otherwise determined. This relationship may be represented by data stored in a lookup table or by a mathematical function implemented in hardware, firmware or software.

In one embodiment, the battery capacity tester includes a constant current sink coupled to the terminals of the battery. The constant current sink is constructed and arranged to draw at least two successive, substantially constant currents from the battery. The battery capacity tester also includes a battery characterizer coupled to the constant current sink and battery terminals. The battery characterizer is constructed and arranged to generate a remaining battery capacity based on a predetermined relationship between the internal battery impedance and capacity for the battery. The internal battery impedance is determined based on a battery voltage measured during each current draw. The constant current sink can be implemented as a constant current source coupled to the battery and supplying a constant current to a load having a known resistance for dissipating the currents.

In one embodiment, the battery characterizer includes at least one lookup table containing the precharacterized battery capacity data that can be accessed by the measured internal battery impedance. In another embodiment, a voltage measurement device is coupled to the battery terminals, providing voltage measurements obtained during each constant current draw. In one aspect of this embodiment, the relationship between the internal battery impedance and the remaining battery capacity is represented by ratios of voltages and currents for the known load. In another embodiment, the lookup table is arranged by the difference in applied constant currents, and is accessed using the difference between first and second voltage measurements to obtain the internal battery impedance and associated battery capacity. In another embodiment, the battery characterizer includes a computation element executing a source program to determine the remaining battery capacity as a function of the present internal battery impedance.

In another aspect of the invention, a method for determining a remaining battery capacity is disclosed. The method includes the steps of: (1) precharacterizing a relationship between battery impedance and battery capacity for the battery; (2) determining a present internal battery impedance; and (3) determining the remaining battery capacity using the internal battery impedance based on the precharacterized data.

In one embodiment, step (2) includes the steps of: (a) selecting a substantially constant first current; (b) causing the battery to supply the first current to a known load; © measuring a first terminal voltage of the battery during step (b); (d) selecting a second substantially constant current; (e) causing the battery to supply the second current to a known load; (f) measuring a first terminal voltage of the battery during step (e); and (g) determining the internal battery impedance as a function of the ratio of the difference between the first and second voltages and currents.

In another embodiment, the method further includes the step of: (4) storing the precharacterized data in a memory device. In another embodiment of the invention, the method also includes the step of: (4) representing the relationship with a mathematical function.

In another embodiment, the method also includes: (i) determining a delta voltage as the difference between the first and second voltage measurements; and (ii) accessing the lookup table using the delta voltage. The table contains data representing the precharacterized relationship between the internal battery impedance and the remaining battery capacity data. In certain other embodiments, step (4) includes executing a source program to calculate the remaining battery capacity using the mathematical relationship and the first and second battery voltages.

In another embodiment step (g) comprises the step of determining a delta current by subtracting the second current from the first and determining the battery impedance as a ratio of the difference between the first and second voltages and the delta current.

Various embodiments of the present invention provide certain advantages and overcome certain drawbacks of the conventional battery testing techniques. Not all embodiments of the invention share the same advantages and those that do may not share them under all circumstances. This being said, embodiments of the present invention provide numerous advantages including the noted advantage of the rapid and accurate determination of battery impedance and remaining battery capacity. Specifically, embodiments of present invention allow for a rapid and accurate determination regardless of the battery chemistry being used.

BRIEF DESCRIPTION OF THE DRAWING

This invention is pointed out with particularity in the appended claims. The above and further advantages of this invention may be better understood by referring to the following description when taken in conjunction with the accompanying drawings, in which like reference numerals designate like elements:

DETAILED DESCRIPTION

The present invention is a battery capacity testing system and associated method that determines the remaining battery capacity based on a measured internal battery impedance and a predetermined relationship between battery impedance and remaining battery capacity for the battery under test. In the illustrative embodiments described herein, the system measures the battery terminal voltage during one or more successive applications of a known load, where each load draws a predetermined constant current from the battery. The remaining battery capacity is then determined based on a predetermined relationship between the internal battery impedance and the remaining battery capacity of the battery.

Figure 1:
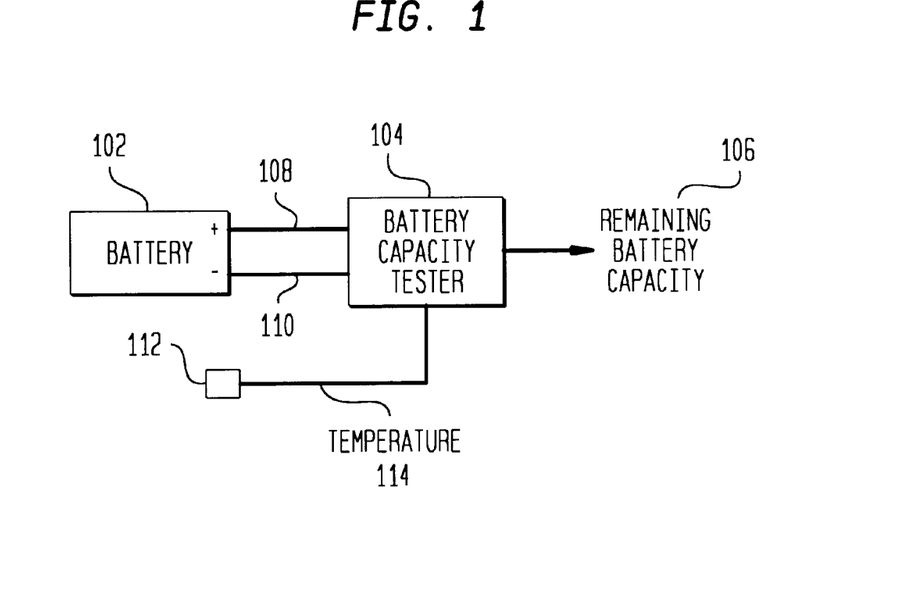
FIG. 1 is a block diagram of a battery capacity tester of the present invention connected to a battery under test.

FIG. 1 is a block diagram of a battery capacity tester for determining remaining battery capacity of a battery under test. The battery under test 102 (battery 102) is electrically connected to the battery capacitor tester 104 at positive connection 108 and negative connection 110. In one embodiment, a temperature sensor 112 provides a signal indicative of battery temperature 114 to the battery capacity tester 104. This sensor can be any temperature sensor now or later developed that senses directly or indirectly the temperature of the battery 102. Battery capacity tester 104 generates a remaining battery capacity 106 in accordance with the present invention. In one embodiment, tester 104 is implemented in a battery powered device. In such an embodiment, battery 102 is typically installed in, and provides internal power to, the battery powered device (not shown). In one exemplary application of the present invention, the battery powered device is a portable defibrillator. As will become apparent from the following description, the portable defibrillator can be used with many different types of rechargeable and non-rechargeable battery chemistries and battery types produced by different manufacturers.

Figure 2:
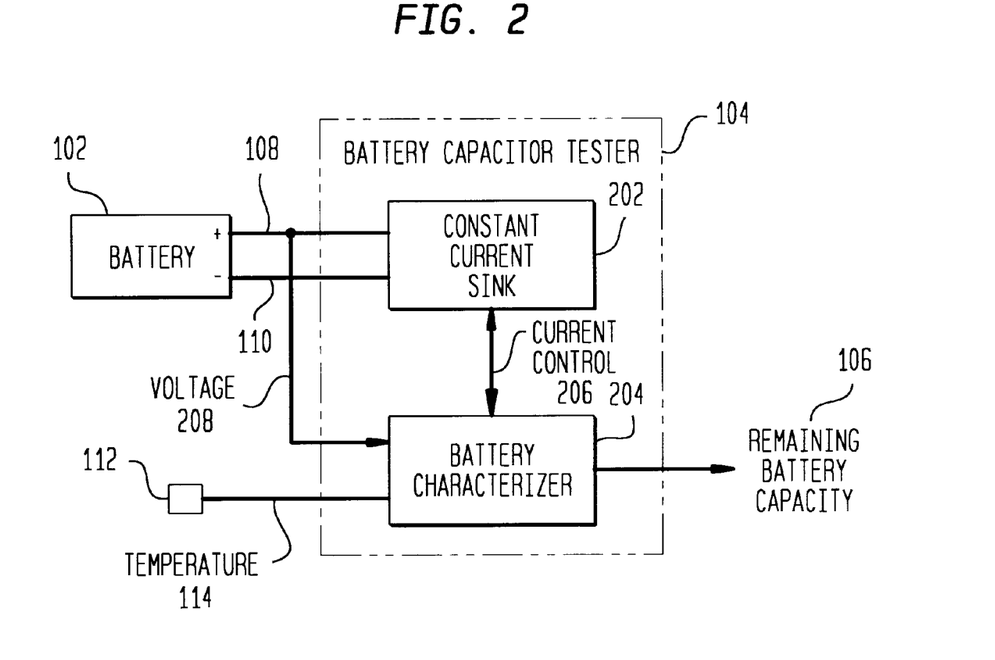
FIG. 2 is a block diagram of one embodiment of the battery capacity tester illustrated in FIG. 1.

FIG. 2 is a block diagram of one embodiment of battery capacity tester 104. Battery capacity tester 104 is shown to have two primary components: a constant current sink 202 and a battery characterizer 204. Constant current sink 202 sinks a specified amount of current discharged from battery 102. As such, constant current sink 202 appears as a load to battery 102. Battery characterizer 204 determines the amount of current to be drawn by constant current sink 202 during each draw, as shown by current control line 206. The battery voltage is sensed during each current draw by the battery characterizer 204, as shown by battery voltage line 208. Battery characterizer 204 uses the specified current and sensed battery voltage to calculate the internal battery impedance. In one embodiment, battery characterizer 204 utilizes the temperature signal 114 provided by temperature sensor 112 in calculating the internal battery impedance. In embodiments where multiple measurements are taken, the difference in voltage and current for each application are utilized to determine the internal impedance of battery 102. In one particular embodiment, the internal impedance is determined by discharging the battery at a first current into a load and then at a second current into the same load. The voltage during each current discharge is measured and the internal impedance is determined by $$z_{int} = \frac{v_1 - v_2}{i_1 - i_2} \quad (1)$$

where $v_1$ is the terminal voltage measure during the $i_1$ current discharge and $v_2$ is the terminal voltage during the $i_2$ discharge.

In embodiments wherein successive measurements are performed, the current drawn from the battery should be sufficiently large so that a measurable difference between the first and second voltages occurs. The amount of current to be drawn from battery 102, therefore, is dependent on the size and capacity of the battery being tested. It would be obvious to one of skill in the art that the current selected can be chosen based on the sensitivity of the voltage measurement device and the characteristics of battery 102.

Figure 3:
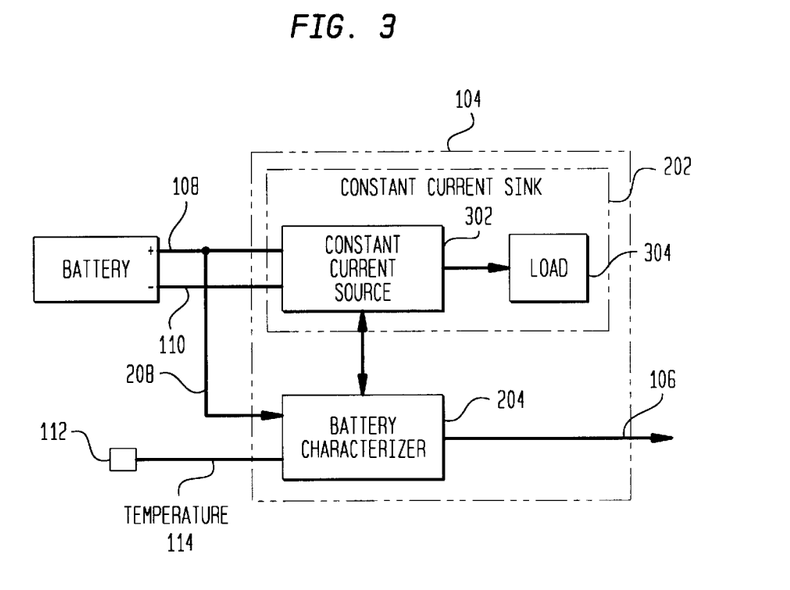
FIG. 3 is a block diagram of one embodiment of the constant current sink illustrated in FIG. 2.

FIG. 3 is a functional block diagram of one embodiment of constant current sink 202. In this embodiment, the constant current sink 202 includes a constant current source 302 and a load 304. Constant current source 302 receives power from battery 102 through positive connector 108 and negative connector 110.

Preferably, current source 302 produces a desired current over a range of input voltages that corresponds to the anticipated voltage range of the battery under test. For example, in embodiments where battery 102 is a NiCd battery rated at 12 volts, the anticipated range of voltages to be measured by tester 104 will be 10–14 volts. In embodiments where battery 102 is a lithium battery rated at 15 volts, the anticipated range of voltages measured by tester 104 will be 10–17 volts. For SLA batteries rated at 12 volts, the anticipated range of voltages measured by tester 104 will be 10–14 volts. In yet another embodiment, the constant current source produces various currents and is able to provide the desired currents over the entire voltage range for the various battery chemistries that are anticipated to be used.

In circumstances where the tester 104 is to test a wide range of batteries, constant current source 302 is preferably a high compliance current source. A high compliance current source is one that produces a desired current over a wide range of input voltages. The design of high compliance current sources is well known in the art.

Preferably, constant current source 302 provides a constant current under a variety of operating conditions. For example, a temperature independent constant current source may be desired under certain circumstances. An increase in the environmental temperature may affect both the constant current source and the battery 102. The temperature characteristics of the semiconductor devices used in constant current source 302 will sometimes lead to increased currents and junction voltages thus causing shifts in output and reference currents. The design of temperature insensitive constant current sources is well-known in the art. Similarly, certain types of batteries are temperature sensitive as well. Terminal voltage as well as current capacity may be affected by temperature. In one embodiment, if the environment cannot be controlled or tester 104 cannot be moved to an alternate environment, the battery characterizer 204 can utilize the temperature signal 114 from temperature sensor 112 to adjust the constant current source 302 to compensate for such effects.

Load 304 may be any load that is well-known and well characterized in terms of its voltage and current relationship. In some battery powered devices, certain internal systems will be so characterized. In one embodiment, system 104 is implemented in a portable defibrillator, such as model M3500B automatic external defibrillator (AED) available from the Hewlett-Packard Company, Andover, Mass., U.S.A. Due to the critical functions performed by defibrillators, the stability and predictability of the electrical characteristics of each sub-system is a common goal of such devices.

In one embodiment of the present invention, in which the system 104 is used within a portable defibrillator, the defibrillator charging circuit (not shown) is selected as the known load 304 due to the high current it draws and, its well-established voltage and current relationship. In an alternative embodiment, other internal systems such as a thermal printer, user interface, or display device may also be used for the battery testing system. In addition, any combination of these systems can be utilized as load 304, so long as the combination adequately characterized as a load. An advantage of this particular embodiment is that no additional components are needed to implement load 304 so that no additional cost is added to the system and there is no dissipative element producing concentrated heat within the system.

In another embodiment, and preferably when tester 104 is implemented as a stand-alone system, load 304 may be implemented by a resistor. This embodiment, however, has the disadvantage of producing excess heat so that temperature shielding and the placement of temperature sensitive components may be necessary.

Figure 4:
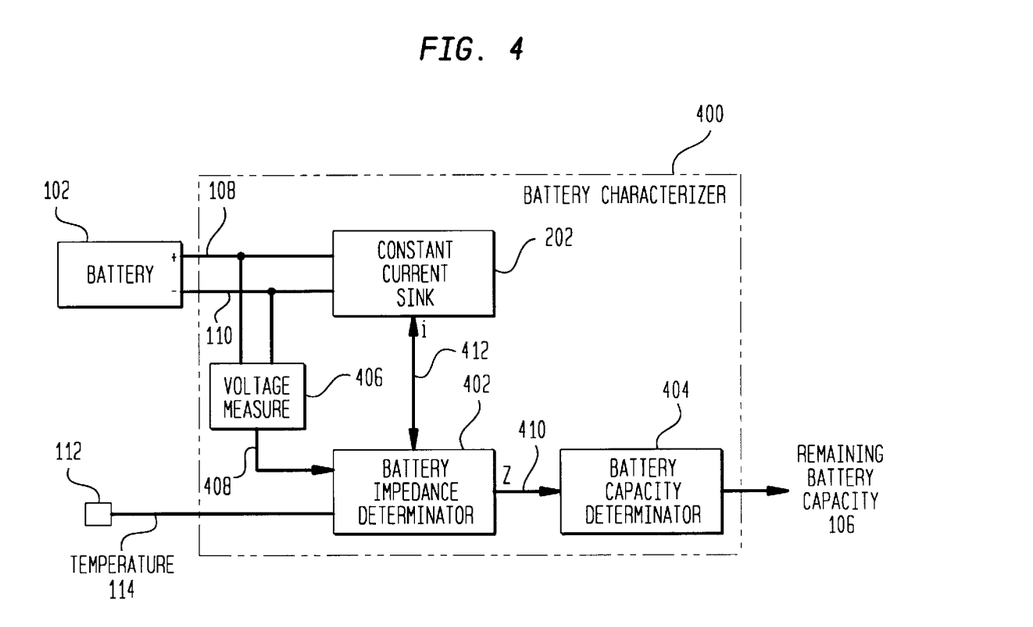
FIG. 4 is a block diagram of one embodiment of the battery characterizer of the present invention.

FIG. 4 shows one embodiment of the battery characterizer, shown in FIG. 4 as battery characterizer 400. In this embodiment, battery characterizer 204 includes an internal battery impedance calculator 402 and a remaining battery capacity calculator 404. In one embodiment, battery impedance calculator 402 determines the currents to be drawn by constant current sink 202 and controls constant current sink 202 via current control line 412. Battery impedance calculator 402 receives the measured voltages via battery measurement line 408 and provides as an output the internal battery impedance Z, 410. In one embodiment, the battery impedance calculator 402 utilizes the temperature signal 114 provided by temperature sensor 112 in calculating the internal battery impedance Z, 410. Battery capacity calculator 404 applies Z 410 value to the precharacterized data and generates the remaining battery capacity 106.

A voltage measurement device 406 measures the terminal voltage of battery 102 through electrical connections 108 and 110. In one embodiment, the voltage measurement device 406 includes an analog-to-digital converter subsystem. The design of a proper analog filter, sampler, and analog-to-digital converter is considered to be well within the ordinary skill in the art. The number of bits of the analog-to-digital converter will depend on the particular application. In one embodiment, a 12 bit converter is utilized.

Figure 5:
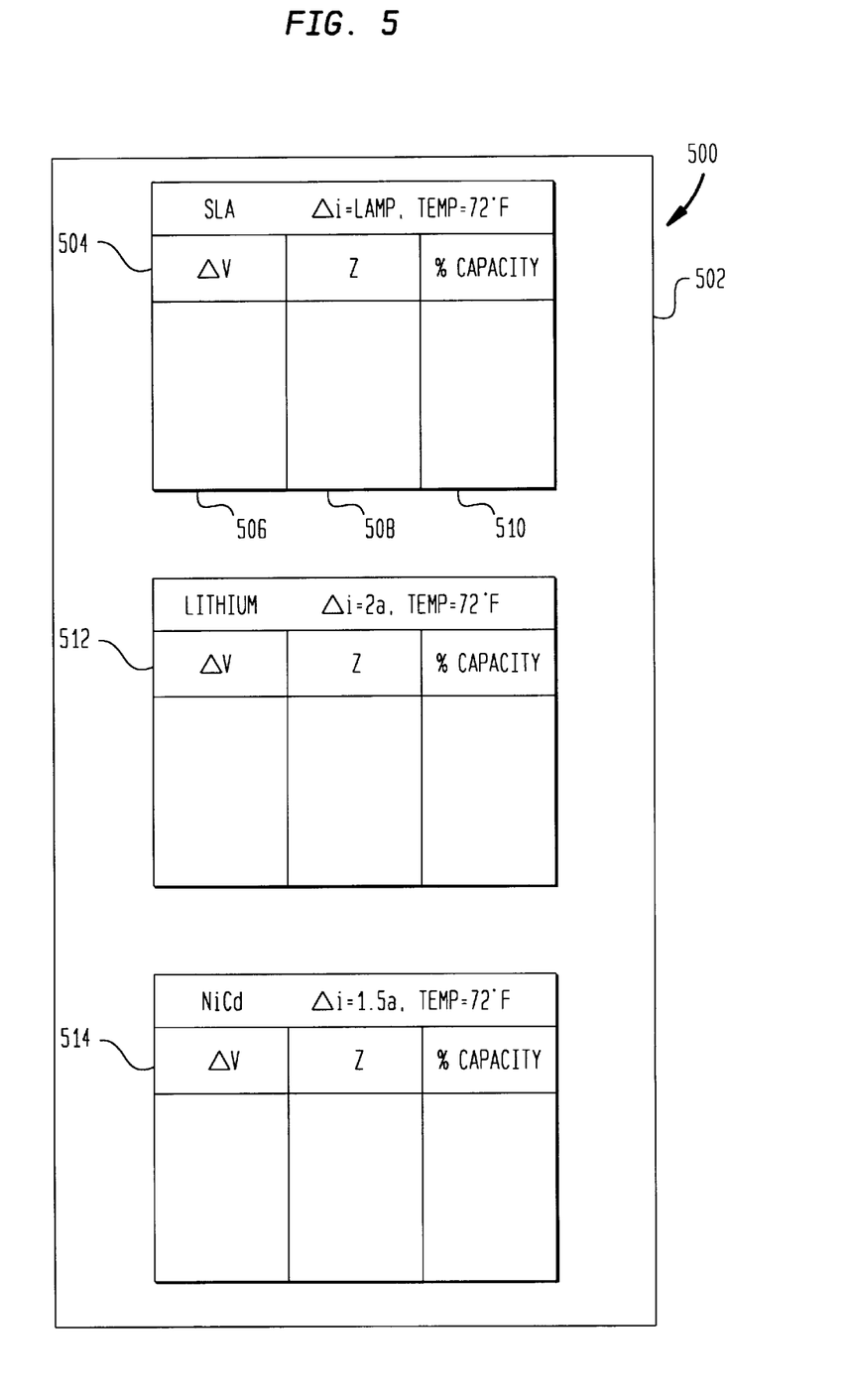
FIG. 5 is a schematic view of the look-up tables used in one embodiment of the present invention.

In one embodiment where the relationship between the internal battery impedance and capacity of battery 102 is complex and not easily represented by a mathematical function, the precharacterized relationship is preferably stored as data points in a memory. In one particular embodiment, the data is stored in one or more look-up tables. Alternatively, where the relationship may be easily represented by a mathematical function, an algorithm implementing the function may be utilized rather than one or more look-up tables. FIG. 5 illustrates one embodiment of a look-up table 500 containing the precharacterized data relating the internal battery impedance to the remaining battery capacity. Look-up table 500 can be stored in a memory device or a region accessible to battery capacitor calculator 404. In one embodiment, look-up table 500 includes multiple look-up tables, each corresponding to a particular battery chemistry. In the illustrative embodiment shown in FIG. 5, there are three lookup tables 504, 512 and 514 representing precharacterized data for SLA; Lithium, and NiCd batteries, respectively.

In an alternative embodiment, the precharacterized data may also be arranged according to the difference in successively applied currents, $\Delta i$. In such an embodiment, individual or linked tables, each identified by a particular $\Delta i$, are included in table 500. This current can be different for some batteries produced by different manufacturers having different construction methods or having different battery chemistries. Different battery chemistry types have different load and current capabilities. In addition, each look-up table can also be identified by a temperature or temperature range for which it contains data. Thus, a look-up table for a particular battery can be identified both by the temperature or temperature range and by its chemistry type. In the illustrative embodiment, each lookup table contains 3 columns of data. The first column 506, represents the difference between the first and second voltage measurements. The second column 508, represents the value of the internal battery impedance as determined by equation (1). The third column 510, contains the precharacterized data of the remaining battery capacity associated with the internal battery impedance. The associated battery impedance is the associated $\Delta i$ divided by the $\Delta v$ for the particular table or list. In the illustrative embodiment, look-up table 500 is selected based on the $\Delta i$, the battery chemistry and battery type. The selected look-up table is then accessed using the voltage difference. Since the difference in the currents is known a priori, the data stored in column 508 of the look-up table contains the internal battery impedance, Z, based upon the predetermined $\Delta i$. The data stored in column 510 of the look-up table 514 is the precharacterized data relating the remaining battery capacity to the value of Z.

In one embodiment, the determination of the relationship between the internal battery impedance and the remaining battery capacity is based upon remaining battery capacity gathered empirically from batteries while measurements are made of the internal battery impedance. It would be obvious to one of skill in the art that the data must be gathered from a statistically significant number of batteries to produce data having a sufficient confidence interval and accuracy. In addition, it is preferable that the data gathered from batteries operating in an environment similar to the environment in which the batteries are likely to be used. In particular, the batteries need to be tested and the data gathered in an environment having the same temperature as that in which the batteries will be used. This is because certain batteries are sensitive to temperature variations. In particular, the internal impedance of some batteries is dependent upon temperature sensitive chemical reactions within the battery. Where batteries may be used at a variety of ambient temperatures, data should be gathered at multiple temperatures spanning the expected temperature range of the battery.

In an alternative embodiment, a microprocessor may be used in to increase the accuracy of the outputs based upon the data contained within look-up table 500. Such a microprocessor provides for a more accurate determination of both internal battery impedance and remaining battery capacity when there is no data entry corresponding exactly to the voltage or current difference. The process of interpolation is considered to be known to those skilled in the relevant art.

In another embodiment, empirically collected data as described above can be analyzed and a mathematical function derived therefrom. Many different curve-fitting functions or approximation techniques may be used. In one embodiment, a least-squares technique is used to derive polynomial functions approximating the relationship between the remaining battery capacity data and the internal battery impedance. In alternative embodiments, any suitable set of basis functions can be used to derive mathematical functions approximating the relationship between the remaining battery capacity and the internal battery impedance.

In such embodiments, a microprocessor or general-purpose computer (not shown) is utilized to execute a source code program stored either in RAM or ROM, performing the computation or accessing the look-up table to determine battery capacity. The source program may be implemented any language suitable for creating a source code file executable by the microprocessor. For instance, C, C++, Basic, Fortran, Assembly, and Pascal programming languages may be used.

In one embodiment, the source code program would have as an input the first and second voltage measurements corresponding to the first and second current levels, respectively. Thus, the source code program would provide the internal battery impedance as a direct calculation using the formula (1) shown above. Using the mathematical relationship between the internal battery impedance and remaining battery capacity developed as described above, the internal battery impedance is used to determine the remaining battery capacity.

Figure 6:
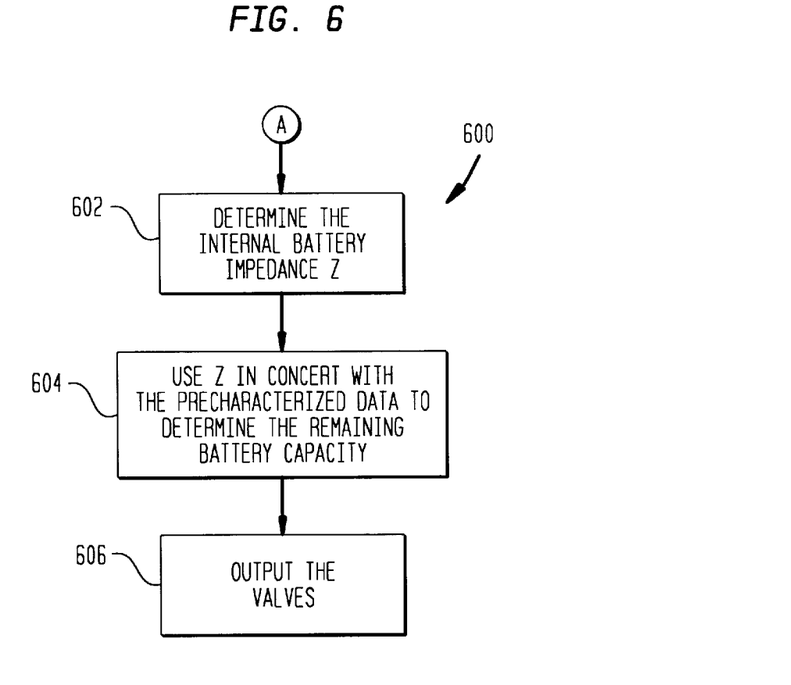
FIG. 6 is a flow chart of one embodiment of a method of practicing the present invention.

A flowchart illustrates one embodiment of a method 600 for determining the internal battery impedance and remaining battery capacity for a battery under test is provided in FIG. 6. In step 602, the internal battery impedance is determined. In step 604, the remaining battery capacity is determined using the internal battery impedance and the precharacterized data.

Figure 7A:
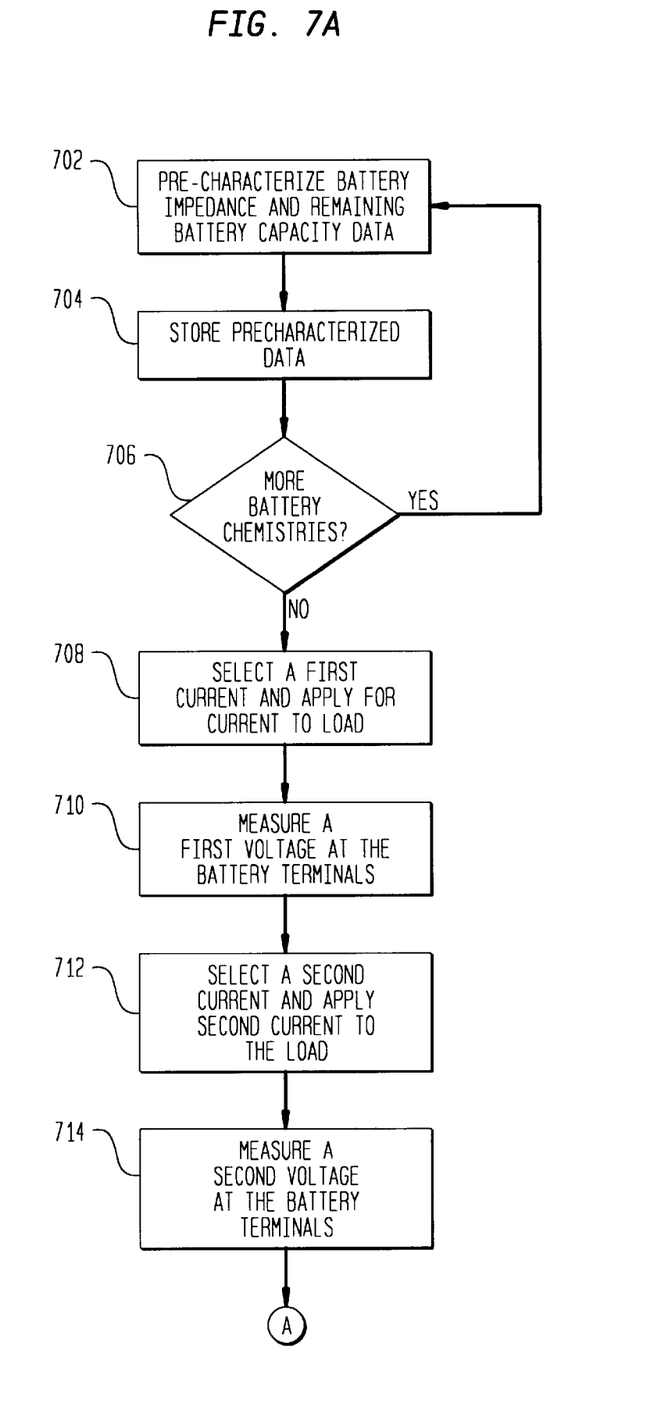
FIGS. 7A and 7B are a flow chart of another embodiment of a method of practicing the present invention.
Figure 7B:
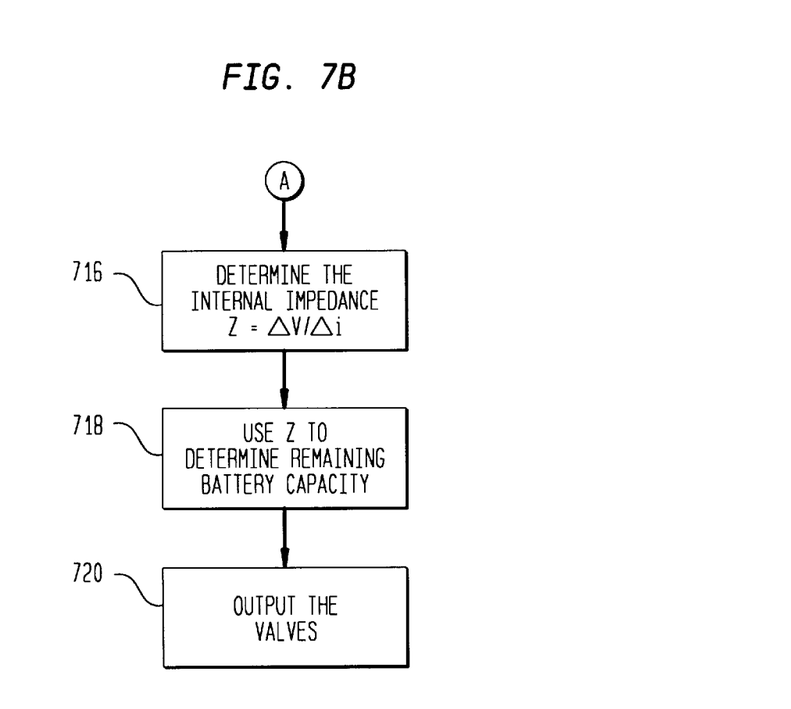

FIGS. 7A and 7B are a flowchart of one embodiment of a process for determining the internal battery impedance and remaining battery capacity for a battery under test. In steps 702 through 706 data relating the internal battery impedance to the remaining battery capacity is pre-characterized. For each different battery chemistry being considered, that battery's particular data is appropriately stored. In step 708 a first current is selected and the battery discharges the current to a known load, during which time the battery voltage is measured step 710. In step 712 a second current is selected and the battery discharges the current to the known load, during which time the battery voltage is measured step 714. The internal battery impedance is determined based upon the voltages measured and/or the currents used, step 716. The remaining battery capacity is then determined in step 718 and is output in step 720.

In one embodiment of the present invention, step 704 may be implemented in a look-up table storing the precharacterized data in a memory device that is accessible to the controller. The data may be stored according to a variety of methods including a linked list, table, data structure, or array. It is within the skill one of ordinary skill in the art to implement this look-up table.

It should be understood that various changes and modifications of the embodiments shown in the drawings and described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A battery capacity tester for determining a remaining capacity of a battery electrically coupled to the battery capacity tester, said battery capacity tester comprising:

a constant current sink, electrically coupled to the battery, constructed and arranged to draw at least a first and a second substantially constant current from the battery; and a battery characterizer, operationally coupled to said constant current sink and the battery, constructed and arranged to determine a remaining capacity of the battery based on a predetermined relationship between battery impedance and capacity for the battery, wherein an instantaneous internal battery impedance is determined based on a battery voltage measured during each said draw of said first and second substantially constant currents.

2. The battery capacity tester of claim 1, wherein said constant current sink comprises:

a constant current source electrically coupled to the battery, said constant current source drawing said at least first and second constant currents; and a load having a known resistance electrically connected to said constant current source, said load constructed and arranged to dissipate said first and second constant currents.

3. The battery capacity tester of claim 1, wherein said constant current sink comprises:

a variable load configured to be coupled to the battery, said variable load having an adjustable impedance; and a controller coupled to the battery and said variable load, constructed and arranged to adjust said impedance of said load in relation to a measured battery voltage to cause said battery to discharge said at least first and second constant currents.

4. The battery capacity tester as in claim 1, wherein said battery characterizer comprises:

at least one look-up table containing data relating remaining battery capacity and internal battery impedance.

5. The battery capacity tester of claim 4, wherein said battery characterizer comprises:

a voltage measurement device electrically connected to terminals of the battery, said voltage measurement device constructed and arranged to measure said at least first and second voltages generated in response to said drawing of said corresponding first and second substantially constant currents.

6. The battery capacity tester of claim 5, wherein said battery characterizer further comprises:

at least one look-up table containing data representing said predetermined relationship between said battery impedance and said battery capacity, wherein said battery characterizer accesses said look-up table with said first and second voltage measurements to obtain first and second associated internal battery impedance and battery capacity.

7. The battery capacity tester of claim 1, wherein said battery characterizer comprises:
a computation element constructed and arranged to calculate said remaining battery capacity as a function of said internal battery impedance based on said predetermined relationship between said battery impedance and said battery capacity.

8. The battery capacity tester of claim 7, wherein said battery characterizer further comprises:
a voltage measurement device coupled to the battery terminals, said voltage measurement device constructed and arranged to measure at least first and second voltages corresponding to said first and second substantially constant currents.

9. The battery capacity tester of claim 8, wherein said battery impedance in said predetermined relationship between said battery impedance and said battery capacity is represented by ratios of voltages and current for said known load.

10. A method for determining a remaining battery capacity of a battery, comprising:
(1) determining an internal battery impedance of the battery comprising
 (a) causing the battery to supply a first substantially constant current,
 (b) measuring a first terminal voltage of the battery during said step (1)(a),
 (c) causing the battery to supply substantially constant second current,
 (d) measuring a second terminal voltage of the battery during said step (1)(c), and
 (e) determining the internal battery impedance as a function of a ratio of the difference between said first and second voltages and said first and second currents; and
(2) determining a remaining battery capacity using said determined internal battery impedance and a predetermined relationship between internal battery impedance and remaining battery capacity for the battery.

11. The method of claim 10, wherein determining the internal battery impedance comprises:
(a) selecting a substantially constant first current;
(b) causing the battery to supply said first current to a known load;
(c) measuring a first terminal voltage of the battery during said step (1)(b);
(d) selecting a substantially constant second current;
(e) causing the battery to supply said second current to the known load;
(f) measuring a second terminal voltage of the battery during said step (1)(e);
(g) determining the internal battery impedance as a function of a ratio of the difference between said first and second voltages and said first and second currents.

12. The method of claim 10, further comprising the steps of:
(3) determining, prior to said step (2), said relationship between said internal battery impedance and said remaining battery capacity for the battery; and
(4) storing data representing said relationship in a memory device.

13. The method of claim 10, wherein said step (1)(e) comprises the step of:
i) determining a difference between said first and second voltage measurements;
ii) determining a difference between said first and second constant currents; and
iii) determining said internal battery impedance by dividing said voltage difference by said current difference.

14. The method of claim 10, further including the steps of:
(3) determining, prior to said step (2), said relationship between said internal battery impedance and said remaining battery capacity for the battery; and
(4) representing said relationship with a mathematical function.

15. The method for determining remaining battery capacity as in claim 14, wherein the step of determining the battery impedance further includes the step of:
executing a source program to calculate the remaining battery capacity using said mathematical relationship and first and second voltages.

16. A defibrillator comprising:
a battery capacity tester for determining a remaining capacity of a battery installed in the defibrillator and electrically connected to said battery capacity tester, wherein said battery capacity tester comprises:
 a constant current sink, electrically coupled to the battery, constructed and arranged to draw a plurality of constant currents from the battery; and
 a battery characterizer electrically coupled to said constant current sink and the battery to determine a remaining capacity of the battery based on a predetermined relationship between battery impedance and battery capacity for the battery, wherein an internal battery impedance is determined based on a battery voltage measured during each said draw of said plurality of constant currents.

17. The defibrillator of claim 16, wherein said constant current sink comprises a charging circuit of the defibrillator, said charging circuit constructed and arranged to charge one or more capacitors such that said charging circuit draws a specified constant current.

18. The defibrillator of claim 16, wherein said battery characterizer comprises:
at least one look-up table containing data relating remaining battery capacity and internal battery impedance.

19. The defibrillator of claim 18, wherein said battery characterizer comprises:
a voltage measurement device electrically connected to terminals of the battery, said voltage measurement device constructed and arranged to measure said at least first and second voltages generated in response to said drawing of said corresponding first and second substantially constant currents.

20. The defibrillator of claim 16, wherein said battery characterizer comprises:
a computation element constructed and arranged to calculate said remaining battery capacity as a function of said internal battery impedance based on said predetermined relationship between said battery impedance and said battery capacity.

* * * * *